(12) United States Patent
Tan et al.

(10) Patent No.: US 7,928,703 B2
(45) Date of Patent: Apr. 19, 2011

(54) ON-CHIP CURRENT SENSING

(75) Inventors: Wenxiao Tan, Murphy, TX (US);
Juergen Luebbe, Plano, TX (US)

(73) Assignee: Texas Instruments Incorporated, Dallas, TX (US)

( * ) Notice: Subject to any disclaimer, the term of this patent is extended or adjusted under 35 U.S.C. 154(b) by 46 days.

(21) Appl. No.: 12/433,273

(22) Filed: Apr. 30, 2009

(65) Prior Publication Data

US 2010/0277142 A1    Nov. 4, 2010

(51) Int. Cl.
*G05F 1/613* (2006.01)
(52) U.S. Cl. .......................... 323/224; 323/283; 323/284
(58) Field of Classification Search .................. 323/224, 323/283, 284
See application file for complete search history.

(56) References Cited

U.S. PATENT DOCUMENTS 6,781,354 B2 *   8/2004   Zhang ........................... 323/224
* cited by examiner

*Primary Examiner* — Shawn Riley
(74) *Attorney, Agent, or Firm* — Dawn V. Stephens; Wade James Brady, III; Frederick J. Telecky, Jr.

(57) ABSTRACT

One embodiment of the invention includes an on-chip current-sense system for measuring a magnitude of an output current through a power transistor. The system includes a first sense transistor that conducts a first reference current to or from a phase node and a second sense transistor configured to conduct a second reference current to or from a power rail. The first and second sense transistors can be substantially identical and can be proportionally matched to the power transistor. An OTA receives the first and second reference currents and a third reference current that flows to or from the phase node and generates a sense current that is proportional to the output current in response to the first, second, and third reference currents. A sense circuit compares the sense current with a predetermined magnitude and generates an over-current signal in response to the sense current being greater than the predetermined magnitude to indicate an over-current condition of the output current.

20 Claims, 6 Drawing Sheets

ON-CHIP CURRENT SENSING

TECHNICAL FIELD

This invention relates to electronic circuits, and more specifically to on-chip current sensing.

BACKGROUND

There is an ever increasing demand for power conversion and regulation circuitry to operate with increased efficiency and reduced power to accommodate the continuous reduction in size of electronic devices. Switching regulators have been implemented as an efficient mechanism for providing a regulated output in power supplies. One such of regulator is known as a switching regulator or switching power supply, which controls the flow of power to a load by controlling the on and off duty-cycle of one or more switches coupled to the load. Many different classes of switching regulators exist today.

It is sometimes desirable to be able to monitor a magnitude of current that flows through the switches of a switching regulator. Some switching regulator integrated circuits (ICs) may incorporate additional input pins to accommodate an external sense resistor and/or associated sensing circuitry. Such methods thus are subject to additional cost and/or space to incorporate the additional input pins and the associated circuitry. Other switching regulator ICs may incorporate current-mirror transistors to mirror a portion of the current through the switches to monitor the magnitude of the current. However, such current-mirroring techniques are typically subject to inaccuracy that may result from non-linearity of the mirrored current.

SUMMARY

One embodiment of the invention includes an on-chip current-sense system for measuring a magnitude of an output current flowing one of to and from a phase node and through a power transistor. The system includes a first sense transistor configured to conduct a first reference current one of to and from the phase node and a second sense transistor configured to conduct a second reference current one of to and from a power rail. The first and second sense transistors can be substantially identical and can be proportionally matched with the power transistor. The system also includes an operational transconductance amplifier (OTA) configured to receive the first reference current, the second reference current, and a third reference current that flows one of to and from the phase node and to generate a sense current that is substantially linearly related to the output current in response to the first, second, and third reference currents. The system further includes a sense circuit configured to compare the sense current with a predetermined magnitude and to generate an over-current signal in response to the sense current being greater than the predetermined magnitude to indicate an over-current condition associated with the output current.

Another embodiment of the invention includes a method for sensing a magnitude of an output current flowing one of to and from a phase node and through a power transistor. The method includes monitoring an activation of the power transistor that generates the output current and controlling a first sense transistor via a control signal that is associated with the activation of the power transistor to conduct a first reference current one of to and from the phase node. The method also includes controlling a second sense transistor via the control signal to conduct a second reference current one of to and from a power rail and conducting a third reference current one of to and from the phase node in response to the control signal. The first and second sense transistors can be substantially identical and can be proportionally matched with the power transistor. The method also includes generating a sense current having a magnitude that is linearly related to a magnitude of the output current based on the first, second, and third reference currents. The system further includes comparing the magnitude of the sense current to a predetermined magnitude and generating an over-current signal in response to the magnitude of the sense current being greater than the predetermined magnitude to indicate an over-current condition associated with the output current.

Another embodiment of the invention includes an on-chip current-sense system for measuring a magnitude of an output current flowing one of to and from a phase node and through a power transistor. The system includes means for conducting a first reference current one of to and from the phase node and means for conducting a second reference current one of to and from a power rail. The system also includes means for generating a sense current that is substantially linearly related to the output current in response to the first reference current, the second reference current, and a third reference current that flows one of to and from the phase node. The system further includes means for comparing the magnitude of the sense voltage with a predetermined reference voltage and for generating an over-current signal in response to the magnitude of the sense voltage being greater than the magnitude of the predetermined reference voltage to indicate an over-current condition associated with the output current.

DETAILED DESCRIPTION

Figure 1:
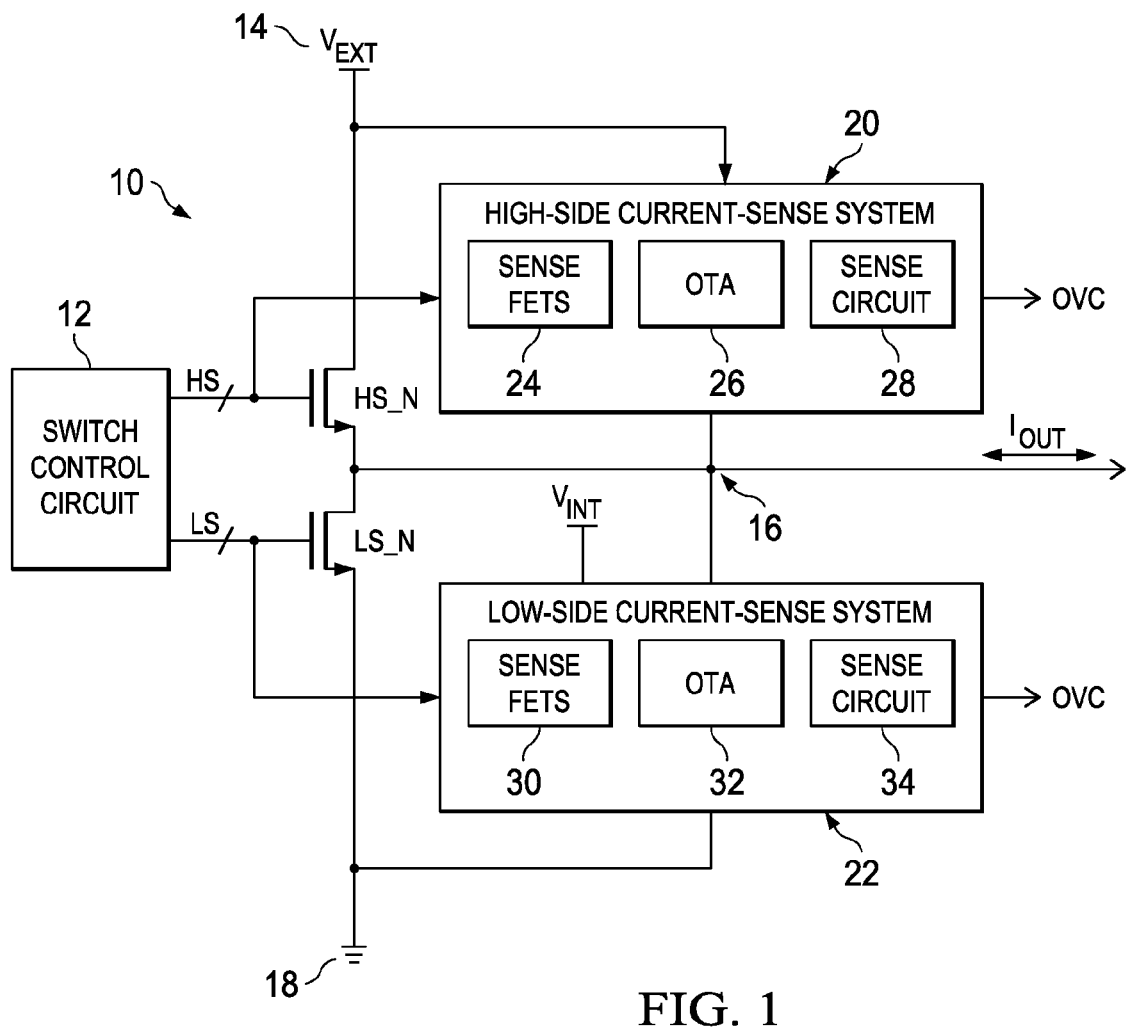
FIG. 1 illustrates an example of a power regulator system in accordance with an aspect of the invention.

The invention relates to electronic circuits, and more specifically to on-chip current sensing. An on-chip current sensing system can be configured to monitor an output current flowing to or from a phase node and through a power transistor, such as a high-side and/or a low-side power transistor in a switching power regulator. The on-chip current sensing system can thus generate an over-current signal to indicate an over-current condition in response to the output current being greater than a predetermined magnitude. The on-chip current sensing system can include a first current sensing transistor, such as a laterally-diffused metal-oxide semiconductor field-effect transistor (LDMOSFET), that is configured to conduct a first reference current from the phase node in response to a control signal. The system can also include a second current-sensing transistor that is configured to conduct a second reference current from a power rail in response to the control signal.

The first and second reference currents, as well as a third reference current that is conducted from the phase node associated with the power transistor can be provided to an operational transconductance amplifier (OTA) that is configured to generate a sense current that is substantially linearly related (i.e., proportional) to the output current. As an example, the OTA can include a current control circuit that is configured to conduct a first bias current that is a portion of the first reference current in a first current path, a second bias current that is a portion of the second reference current in a second current path, and the third reference current in a third current path, with the first and second bias currents being approximately equal. The first and second bias currents can be generated by bias current sources in the OTA and can be implemented to set a bias that controls a magnitude of the sense current, such as via a cascode amplifier. The OTA can also include a switching control circuit that is configured to couple the first, second, and third current paths to the power rail prior to full activation of the power transistor, such that the first, second, and third current paths are prebiased to substantially mitigate transient effects for more accurate output current sensing.

The sense current is provided to a sense circuit. The sense circuit can be configured to generate a sense voltage that is proportional to the sense current and to compare the sense voltage with a predetermined reference voltage. The sense circuit can thus be configured to generate the over-current signal upon the sense voltage being greater than the predetermined reference voltage. The sense circuit can also include a trimmable current source that can contribute to the generation of the reference voltage that can be adjustable to substantially mitigate a sensing offset of the current sensing system that is contributed by an intentionally added deterministic sense offset current, by an input offset voltage from the OTA that is a voltage difference between a first input of the OTA that receives the first bias current and a second input of the OTA that receives the second bias current, as well as by an offset voltage from the sense circuit. The sense circuit can further include a trimmable resistor associated with the reference voltage that is adjustable to adjust a sensing gain of the current sense circuit to a predetermined value. The configuration of the on-chip current-sensing system can thus provide an accurate manner of sensing the magnitude of the output current through the power transistor based on maintaining a substantially linear relationship between the sense current and the output current over a wide range of output current magnitudes.

FIG. 1 illustrates an example of a power regulator system 10 in accordance with an aspect of the invention. All or part of the power regulator system 10 can be a portion of a switching power regulator, such as a buck, boost, and/or buck/boost power switching regulator, such that all or part of the power regulator system 10 can be implemented to generate an output voltage based on a current flow through an inductive load (not shown). The power regulator system 10 can be implemented in any of a variety of applications, such as in a portable electronic device, a wireless communication device, or a disk-drive motor. As such, the power regulator system 10 can be implemented on or as a portion of an integrated circuit (IC).

The power regulator system 10 includes a switch control circuit 12 that is configured to generate one or more switching control signals. In the example of FIG. 1, the switching control signals are demonstrated as a high-side control signal HS and a low-side control signal LS. The high-side control signal HS is provided to a high-side power metal-oxide semiconductor field-effect transistor (MOSFET) HS_N and the low-side control signal LS is provided to a low-side power MOSFET LS_N. As an example, the high-side and low-side power MOSFETs HS_N and LS_N can be LDMOSFETs. It is to be understood that, in the example of FIG. 1, the high-side and low-side control signals HS and LS can include one or more digital and/or analog signals corresponding to activation and/or status of the high-side and low-side power MOSFETs HS_N and LS_N. For example, the switching control circuit 12 can include a set of drivers that are each activated in response to one or more logic signals, such as to substantially mitigate a shoot-through current through the high-side and low-side power MOSFETs HS_N and LS_N. Therefore, the high and low-side control signals HS and LS can each include one or more digital or analog signals that are each controlled by the switch control circuit 12 to respectively activate and deactivate the high and low-side power MOSFETs HS_N and LS_N.

Upon activation of the high-side power MOSFET HS_N, an output current $I_{OUT}$ flows from a high-voltage power rail 14 having a voltage $V_{EXT}$ through the high-side power MOSFET HS_N and out of a phase node 16. As an example, the voltage $V_{EXT}$ can be a power voltage that is externally provided to the IC in which the power regulator system 10 is configured. Similarly, upon activation of the low-side power MOSFET LS_N, the output current $I_{OUT}$ can flow from the phase node 16 through the low-side power MOSFET LS_N to a low-voltage power rail 18, demonstrated in the example of FIG. 1 as ground.

The power regulator system 10 also includes a high-side current-sense system 20. The high-side current-sense system 20 can be configured to monitor the magnitude of the output current $I_{OUT}$ that flows through the high-side power MOSFET HS_N and out of the phase node 16. Specifically, the high-side current-sense system 20 can generate an over-current signal OVC upon the magnitude of the output current $I_{OUT}$ being greater than a predetermined magnitude. The power regulator system 10 further includes a low-side current-sense system 22. The low-side current-sense system 22 can be configured to monitor the magnitude of the output current $I_{OUT}$ that flows through the low-side power MOSFET LS_N from the phase node 16. Similar to the high-side current-sense system 20, the low-side current-sense system 22 can generate an over-current signal OVC upon the magnitude of the output current $I_{OUT}$ being greater than a predetermined magnitude.

In the example of FIG. 1, the high-side current-sense system 20 includes sense MOSFETs 24, an operational transconductance amplifier (OTA) 26, and a sense circuit 28, and the low-side current-sense system 22 includes sense MOSFETs 30, an OTA 32, and a sense circuit 34. The sense MOSFETs 24 and 30 can each include one or more sense MOSFETs that are configured to conduct respective reference currents associated with the output current $I_{OUT}$. As an example, the sense MOSFETs 24 and 30 can each include a pair of matched MOSFETs that are configured, respectively, to conduct a first reference current and a second reference current from the respective one of the power rails 14 and 18 in response to a respective one or more of the high-side and low-side control signals HS and LS. Each of the MOSFETs in the sense MOSFETs 24 and 30 can have a size that is smaller than the respective power MOSFETs HS_N and LS_N. The OTAs 26 and 32 can each be configured to receive the first and second reference currents, as well as a third reference current, to generate a sense current that has a magnitude that is substantially linearly related to the magnitude of the output current $I_{OUT}$. The sense circuits 28 and 34 can each thus be configured to compare the respective sense current to a predetermined magnitude that can be tuned to indicate an over-current condition. Accordingly, the sense circuits 28 and 34 can generate the respective over-current signals OVC in response to the magnitude of the output current $I_{OUT}$ exceeding the predetermined magnitude. The high-side and low-side current-sense systems 20 and 22 can thus be configured as an on-chip system to quickly and accurately monitor the magnitude of the output current $I_{OUT}$ based on maintaining linearity over a broad range of magnitudes of the output current $I_{OUT}$.

It is to be understood that the power regulator system 10 is not intended to be limited to the example of FIG. 1. As an example, the power regulator system 10 need not include both the high-side and the low-side current-sense systems 20 and 22, but could instead include just one of the high-side and the low-side current-sense systems 20 and 22. As another example, the power regulator system 10 is not limited to a switching power regulator, but could also be configured as a linear power regulator that conducts the output current $I_{OUT}$ through a single transistor from the high-voltage power rail 14 to the phase node 16 in response to an analog control signal. As such, depending on the linearity and/or sense range requirements, the sense MOSFETs 24 could include one or a pair of matched sense MOSFETs, and the high-side current-sense system 20 could monitor the magnitude of the output current $I_{OUT}$ through the linearly controlled power MOSFET based on the sense MOSFETs 24 being likewise controlled by the analog control signal. Accordingly, the power regulator system 10 can be configured in any of a variety of ways.

Figure 2:
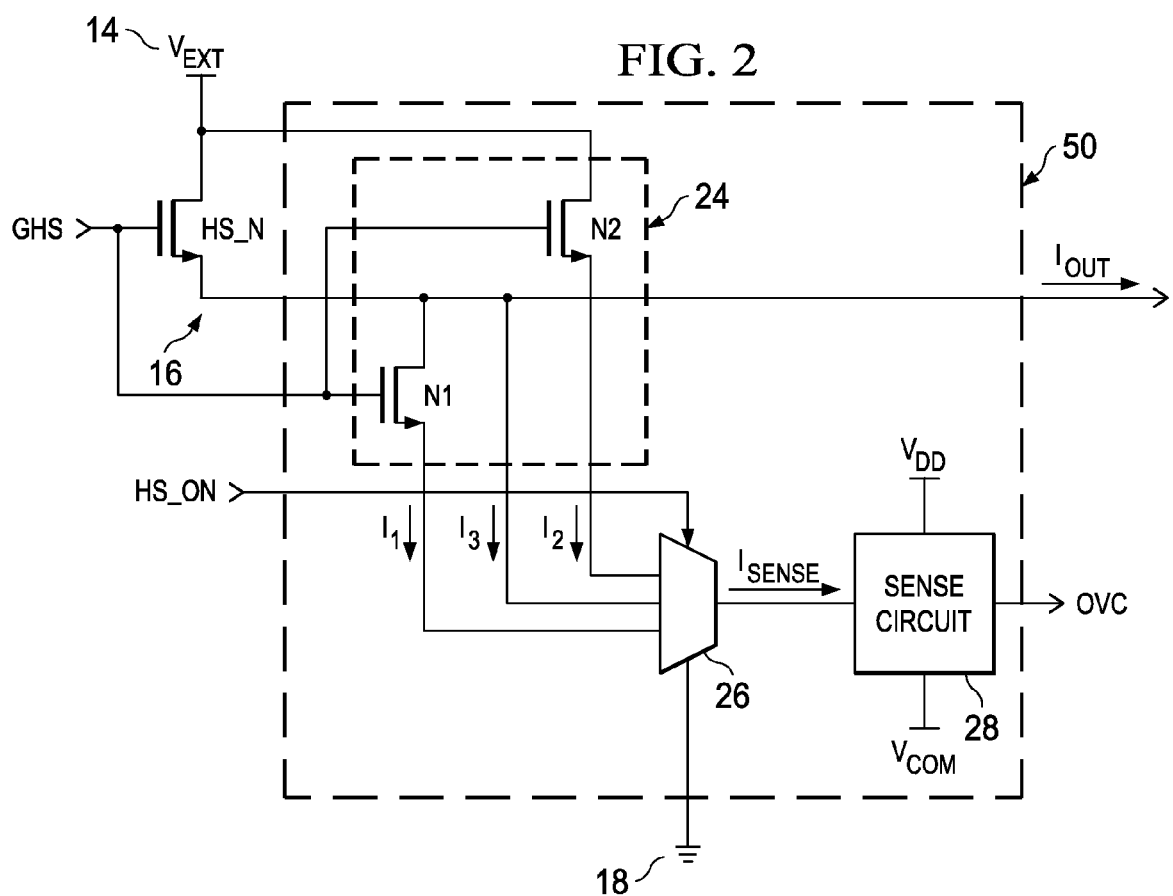
FIG. 2 illustrates an example of a high-side current-sense system in accordance with an aspect of the invention.

FIG. 2 illustrates an example of a high-side current-sense system 50 in accordance with an aspect of the invention. As an example, the high-side current-sense system 50 in the example of FIG. 2 can correspond to the high-side current-sense system 20 in the example of FIG. 1. As such, like reference numbers are used and reference is to be made to the example of FIG. 1 in the following description of the example of FIG. 2.

Similar to as described above in the example of FIG. 1, the high-side current-sense system 50 is configured to monitor a magnitude of the output current $I_{OUT}$ that flows through a power transistor, demonstrated in the example of FIG. 2 as the high-side power MOSFET HS_N. The high-side current-sense system 50 includes the sense MOSFETs 24, which are demonstrated in the example of FIG. 2 as a first N-MOSFET N1 and a second N-MOSFET N2. As an example, the first and second N-MOSFETs N1 and N2 can have a size that is less than the size of the high-side power MOSFET HS_N. Each of the first and second N-MOSFETs N1 and N2 are controlled at a gate by an activation signal GHS. The first N-MOSFET N1 is coupled at a drain to the phase node 16 and is configured to conduct a first reference current $I_1$ from the phase node 16 in response to the activation signal GHS. As an example, the activation signal GHS can be an analog activation signal that is generated from a high-side driver in the switching control circuit 12, and can thus constitute one of the high-side control signals HS. The second N-MOSFET N2 is coupled at a drain to the high-voltage power rail 14 and is configured to conduct a second reference current $I_2$ from the high-voltage power rail 14 in response to the activation signal GHS. In addition, a third reference current $I_3$ is also conducted from the phase node 16 in response to the activation signal GHS. It is to be understood that, based on the flow of the first and third reference currents $I_1$ and $I_3$ from the phase node 16, the magnitude of the current flow through the high-side power MOSFET HS_N is greater than the magnitude of the output current $I_{OUT}$ flowing from the phase node 16 to the load (not shown).

However, the magnitude of the first and third reference currents $I_1$ and $I_3$ can be significantly less than the magnitude of the output current $I_{OUT}$, such that the difference in magnitudes between the current flow through the high-side power MOSFET HS_N and the output current $I_{OUT}$ can be substantially negligible.

The first, second, and third reference currents $I_1$, $I_2$, and $I_3$ are provided to the OTA 26. In response, the OTA 26 generates a sense current $I_{SENSE}$ that has a magnitude that is linearly related to (i.e., proportional to) the output current $I_{OUT}$. As an example, the OTA 26 can be configured to conduct approximately equal bias currents through respective current paths of the OTA 26, such that the bias currents set a magnitude of the sense current $I_{SENSE}$ to be linearly related to the output current $I_{OUT}$. For example, the OTA 26 can include a cascode amplifier that is controlled by one or both of the bias currents.

The sense current $I_{SENSE}$ is provided to the sense circuit 28. The sense circuit 28 is demonstrated in the example of FIG. 2 as interconnecting a voltage $V_{DD}$ and a common voltage $V_{COM}$ at a front end. As an example, the voltages $V_{DD}$ and $V_{COM}$ can be internally provided analog voltage supplies. The voltage $V_{DD}$ can be generated at a magnitude that is less than the external voltage $V_{EXT}$, and the common voltage $V_{COM}$ can have a magnitude that is selected based on an input common mode range of the sense circuit 28. As an example, the common voltage $V_{COM}$ can be ground. The sense circuit 28 is configured to compare the sense current $I_{SENSE}$ with a predetermined magnitude that can be associated with an over-current limit corresponding to the output current $I_{OUT}$. The sense circuit 28 can thus generate the over-current signal OVC in response to the magnitude of the sense current $I_{SENSE}$ exceeding the predetermined magnitude, thus indicating an over-current condition associated with the output current $I_{OUT}$.

For example, the sense circuit 28 can generate a sense voltage having a magnitude that corresponds to the magnitude of the sense current $I_{SENSE}$ and a predetermined reference voltage that is generated from the voltage $V_{DD}$, such that the sense voltage and the predetermined reference voltage can be input to a comparator. In addition, the sense circuit 28 can include a trimmable current source to substantially mitigate a sensing offset of the high-side current-sense system 20. The sense circuit 28 can also include a trimmable resistance that can be adjusted to set an accurate predetermined sensing gain of the high-side current-sense system 20. Accordingly, the sense circuit 28 can be set to provide the over-current signal OVC in response to very accurate and linear current sensing of the output current $I_{OUT}$.

It is to be understood that the high-side current-sense system 20 is not intended to be limited to the example of FIG. 2. As an example, the sense MOSFETs N1 and N2 could be P-type MOSFETs, such as to match a respective high-side power MOSFET that is likewise provided as a P-type MOSFET. As another example, in the above described example of monitoring the output current $I_{OUT}$ in a linear power regulator for some applications, as opposed to a switching power regulator, the sense MOSFET N1 could be omitted entirely. Accordingly, the high-side current-sense system 20 can be configured in any of a variety of ways.

Figure 3:
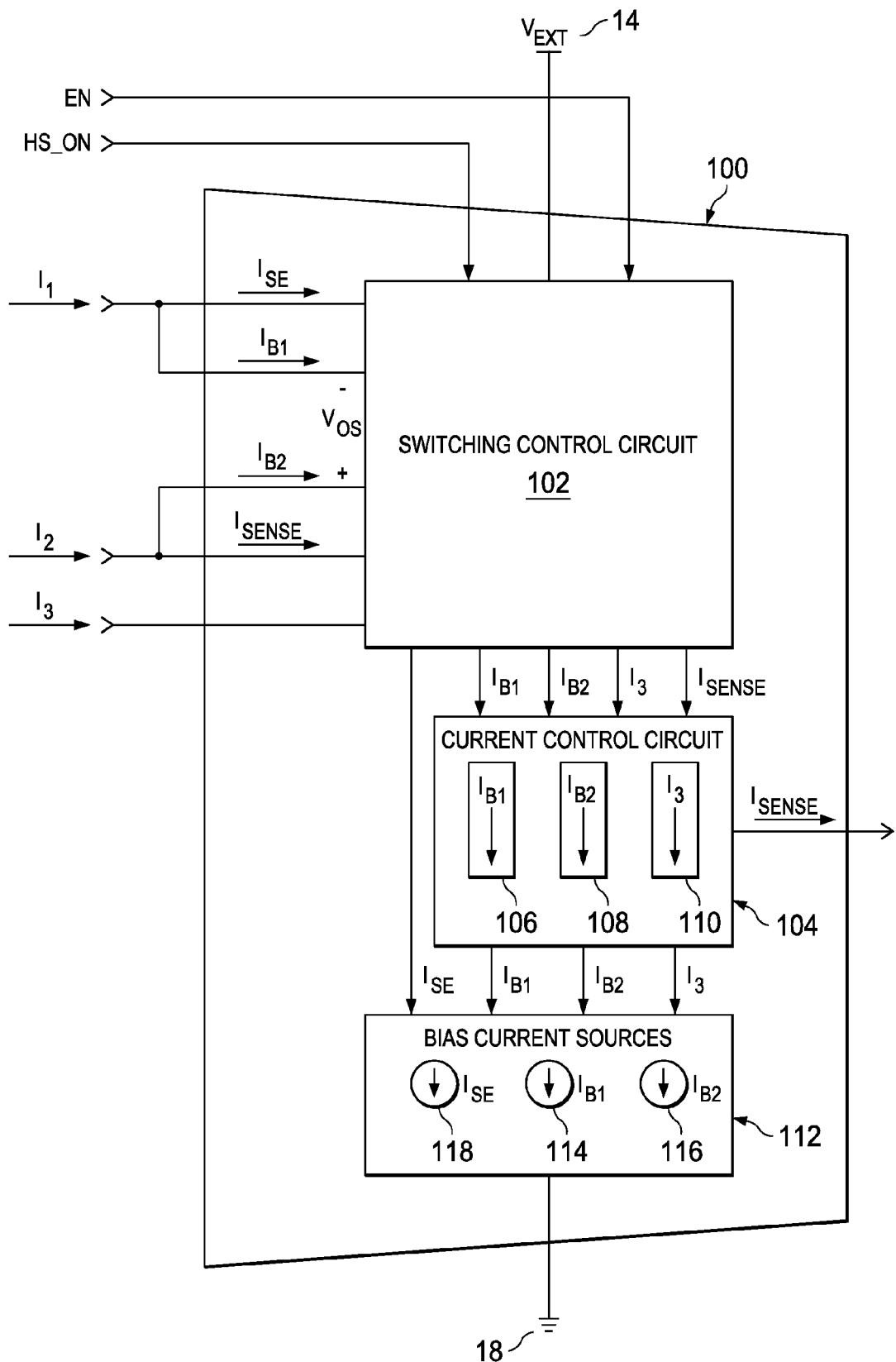
FIG. 3 illustrates an example of an operational transconductance amplifier (OTA) system in accordance with an aspect of the invention.

FIG. 3 illustrates an example of an OTA 100 in accordance with an aspect of the invention. The OTA 100 can correspond to the OTA 26 in the examples of FIGS. 1 and 2. Therefore, reference is to be made to the examples of FIGS. 1 and 2 in the following description of the example of FIG. 3.

The OTA 100 includes a switching control circuit 102. In the example of FIG. 3, the first reference current $I_1$ is split into a first bias current $I_{B1}$ and a sense offset current $I_{SE}$ and the second reference current $I_2$ is split into a second bias current $I_{B2}$ and the sense current $I_{SENSE}$. As described in greater detail below, the sense offset current $I_{SE}$ can be generated from an exact current source, such that the sense offset current $I_{SE}$ can have a substantially constant magnitude. Each of the first and second bias currents $I_{B1}$ and $I_{B2}$, the sense offset current $I_{SE}$, the sense current $I_{SENSE}$, and the third reference current $I_3$ are all provided to the switching control circuit 102. In addition, an enable signal EN and an activation signal HS_ON are also provided to the switching control circuit 102. As an example, the enable signal EN and the activation signal HS_ON can each be a digital signal that controls an activation state of a plurality of switches in the switching control circuit 102, as described in greater detail below. As demonstrated in the example of FIG. 3, an OTA input-referred offset voltage $V_{OS}$ having a minimal magnitude can exist between the inputs of the switching control circuit 102 that receive the first and second bias currents $I_{B1}$ and $I_{B2}$. For example, the magnitude of the offset voltage $V_{OS}$ can be based on process and temperature variations of the electronic components of the OTA 100. As also described in greater detail below, the high-side current-sense system 50 can be configured and tuned to substantially mitigate the effect of the offset voltage $V_{OS}$ on the operation of the high-side current-sense system 20.

The OTA 100 also includes a current control circuit 104. The current control circuit 104 includes a first current path 106 that conducts the first bias current $I_{B1}$, a second current path 108 that conducts the second bias current $I_{B2}$, and a third current path 110 that conducts the third reference current $I_3$. As an example, the first and second current paths 106 and 108 can be configured substantially the same, such that the first and second bias currents $I_{B1}$ and $I_{B2}$ have approximately equal magnitudes. Specifically, the first and second current paths 106 and 108 can be configured as cascode current mirrors or a cascode amplifier to maintain high sensing linearity over a broad range of magnitudes of the output current $I_{OUT}$. As another example, to increase the dynamic range and to decrease the systematic offset of the sense current $I_{SENSE}$, the third current path 110 can be configured as a level-shifter that is controlled by at least one of the first and second current paths 106 and 108. Accordingly, the magnitude of the third reference current $I_3$ can be controlled by the first and/or second bias current $I_{B1}$ and/or $I_{B2}$. The output of the level-shifter in the third current path 110 can thus control a gate of a pass-MOSFET to generate the magnitude of the sense current $I_{SENSE}$, which is output from the current control circuit 104 to the sense circuit 28.

The OTA 100 further includes bias current sources 112. The bias current sources 112 include a first bias current source 114 that conducts the first bias current $I_{B1}$, a second bias current source 116 that conducts the second bias current $I_{B2}$, and a third bias current source 118 that conducts the sense offset current $I_{SE}$. As an example, the first and second bias current sources 114 and 116 can be mirrored from a common current source, and the third bias current source 118 can be an exact current source, such that the sense offset current $I_{SE}$ has a substantially constant magnitude over the process and temperature variations. For example, the sense offset current $I_{SE}$ can be an intentionally added deterministic offset current that has a magnitude that is selected such that, upon the magnitude of the output current $I_{OUT}$ being approximately zero, the OTA 26 can be properly biased to maintain sufficient loop gain and speed for accurate sensing of the magnitude of the output current $I_{OUT}$ under all process variations of the electronic devices of the OTA 100 that result in the offset voltage $V_{OS}$.

The switching control circuit 102 can be configured to enable and disable the OTA 100 in response to the enable signal EN. Specifically, the enable signal EN can be de-asserted (i.e., logic 0) to de-couple the current control circuit 104 and/or the bias current sources 112 from the sense MOS-FETs N1 and N2 and the phase node 16 to disable the OTA 100. Alternatively, the enable signal EN can be asserted (i.e., logic 1) to provide control of the switching control circuit 102 via the activation signal HS_ON.

As an example, the activation signal HS_ON can be asserted to indicate that the high-side power MOSFET HS_N is "nearly settled" or fully activated in a first state, thus indicating that the output current $I_{OUT}$ is ready to be sensed. For example, the assertion of the activation signal HS_ON can be substantially delayed from the assertion of the activation signal GHS based on an amount of time that it takes to activate the high-side power MOSFET HS_N due to the large gate area of the high-side power MOSFET HS_N. Similarly, the activation signal HS_ON can be de-asserted to indicate that the high-side power MOSFET HS_N will be imminently deactivated or fully deactivated in a second state, thus indicating that the output current $I_{OUT}$ is not to be sensed.

Prior to full activation of the high-side power MOSFET HS_N, the current control circuit 104 can be coupled to the voltage $V_{EXT}$ via the de-asserted high-side activation signal HS_ON. Therefore, the electronic components in the current paths 106, 108, and 110, as well as the bias current sources 112, can be pre-biased at a substantially settled state. The pre-biasing of the electronic components in the current paths 106, 108, and 110, as well as the bias current sources 112, can thus substantially mitigate transient effects on the sense current $I_{SENSE}$, such as in response to switching the high and low-side power MOSFETs HS_N and LS_N and can greatly improve sensing speed and accuracy.

It is to be understood that the OTA 100 is not intended to be limited to the example of FIG. 3. As an example, in the above described example of monitoring the output current $I_{OUT}$ in a linear power regulator, as opposed to a switching power regulator, the switching control circuit 102 can be modified such that it is only responsive to the enable signal EN, or it could be omitted entirely. Accordingly, the OTA 100 can be configured in any of a variety of ways.

Figure 4:
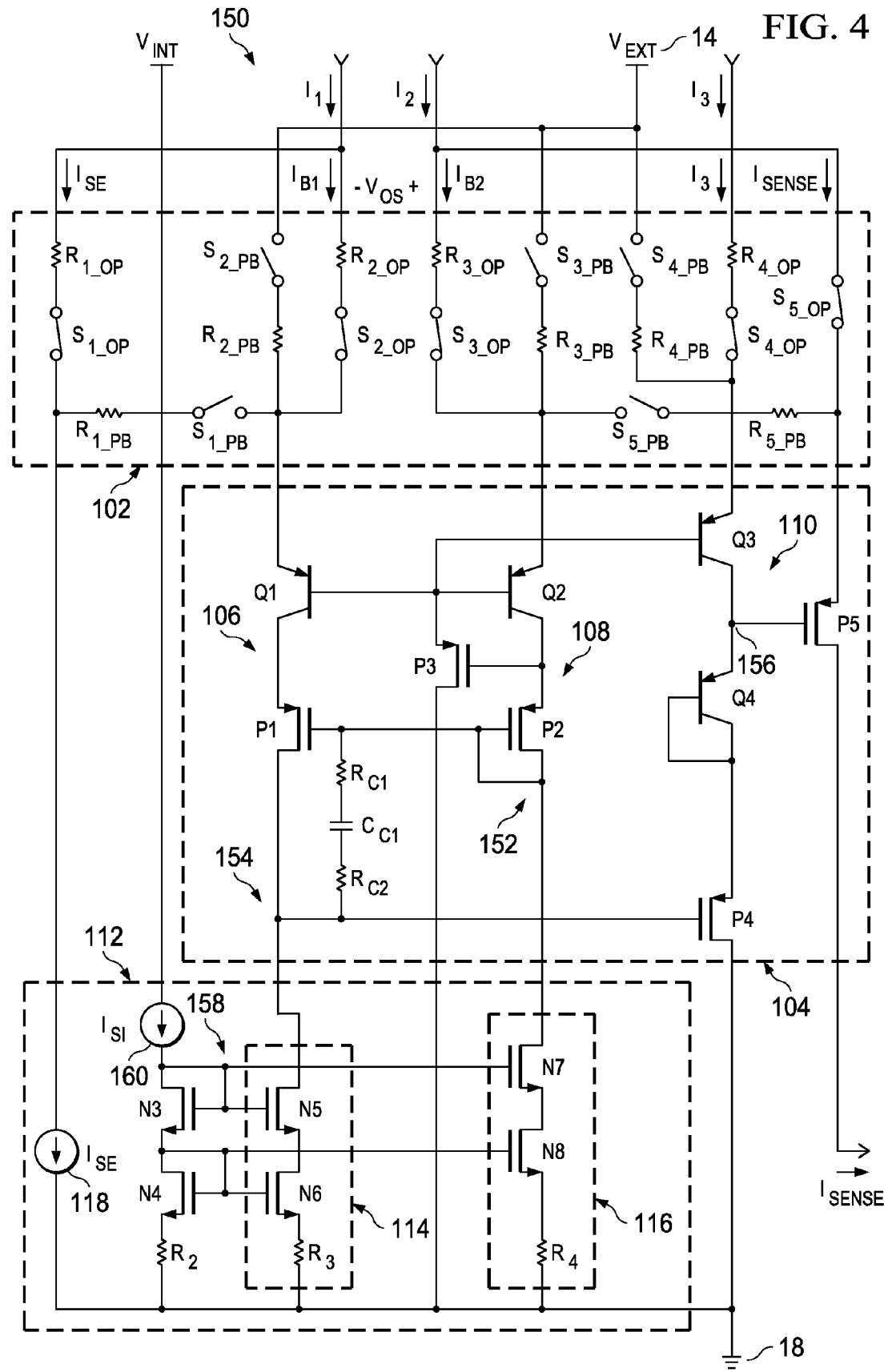
FIG. 4 illustrates an example of an OTA circuit in accordance with an aspect of the invention.

FIG. 4 illustrates an example of an OTA circuit 150 in accordance with an aspect of the invention. The OTA circuit 150 can correspond to the OTA 100 in the example of FIG. 3. Therefore, reference is to be made to the examples of FIGS. 1-3 in the following description of the example of FIG. 4.

The OTA 150 includes the current control circuit 104 and the bias current sources 112. The current control circuit 104 includes the first current path 106 that conducts the first bias current $I_{B1}$ and the second current path 108 that conducts the second bias current $I_{B2}$. Each of the first and second current paths 106 and 108 include respective PNP bipolar junction transistors (BJTs) Q1 and Q2 in series with respective P-MOSFETs P1 and P2 to be configured as a cascode current mirror or a cascode amplifier. The BJTs Q1 and Q2 are arranged in a current-mirror configuration via an interposing P-MOSFET P3 having a source that is coupled to the bases of the BJTs Q1 and Q2, a gate that is coupled to the collector of the BJT Q2, and a drain that is coupled to ground. Similarly, the P-MOSFETs P1 and P2 are arranged in a current-mirror configuration based on the coupling of the respective gates of the P-MOSFETs P1 and P2 and the drain of the P-MOSFET P2 at a node 152. The P-MOSFET P3 can substantially mitigate a contribution to the offset voltage $V_{OS}$ due to the base currents of the BJTs Q1 and Q2, and can substantially improve the sensing speed of the OTA circuit 150. The cascoded current-mirror configuration of the BJTs Q1 and Q2 and P-MOSFETs P1 and P2 is configured to substantially increase the open-loop gain of the OTA circuit 150, to reduce a current mismatch between the first and second current paths 106 and 108 due to a limited output impedance of the BJTs Q1 and Q2, and to maintain substantially high-sensing linearity over a broad range of magnitudes of the output current $I_{OUT}$.

In addition, the current control circuit 104 includes the third current path 110 that includes a PNP BJT Q3, a diode-configured PNP BJT Q4, and a P-MOSFET P4. The base of the BJT Q3 is coupled to the bases of the BJTs Q1 and Q2, and the gate of the P-MOSFET P4 is coupled to a node 154 that is coupled to the drain of the P-MOSFET P1. Therefore, the third current path 110 is configured as a level-shifter having a current that is controlled by the first and second current paths 106 and 108. The output of the level-shifter is demonstrated as a node 156 that controls a gate of a P-MOSFET P5 through which the sense current $I_{SENSE}$ flows. The level-shifter can substantially increase the dynamic range of the sense current $I_{SENSE}$ and substantially reduce the systematic offset of the sense current $I_{SENSE}$. In addition, in the example of FIG. 4, the nodes 152 and 154 are separated by a series-connection of a resistor $R_{C1}$, a capacitor $C_{C1}$, and a resistor $R_{C2}$, with the resistors $R_{C1}$ and $R_{C2}$ having approximately the same resistance magnitude, that are configured to substantially increase a sensing speed in response to transients and to stabilize a frequency response associated with the OTA 150.

Additionally, the bias current sources 112 includes a current-mirror network 158 that is configured to generate the first bias current $I_{B1}$ and the second bias current $I_{B2}$. Specifically, the current-mirror network 158 includes a current source 160 configured to generate a current $I_{SI}$ that flows through N-MOSFETs N3 and N4 and through a resistor $R_2$. As an example, the current source 160 can be generated from an internal voltage supply. The current-mirror network 158 also includes N-MOSFETs N5 and N6 that are arranged in a current-mirror configuration with the N-MOSFETs N3 and N4, respectively, and a resistor $R_3$ that is configured in series with the N-MOSFETs N5 and N6. The N-MOSFETs N5 and N6 and the resistor $R_3$ thus constitutes the first bias current source 114 that conducts the first bias current $I_{B1}$. Similarly, the current-mirror network 158 also includes N-MOSFETs N7 and N8 that are arranged in a current-mirror configuration with the N-MOSFETs N5 and N6, respectively, and a resistor $R_4$ that is configured in series with the N-MOSFETs N7 and N8. The N-MOSFETs N7 and N8 and the resistor $R_4$ thus constitutes the second bias current source 116 that conducts the second bias current $I_{B2}$.

The OTA 150 further demonstrates the switching control circuit 102. The switching control circuit 102 includes a plurality of resistors through which the first, second, and third reference currents $I_1$, $I_2$, and $I_3$ flow depending on the state of a plurality of switches in response to the activation signal HS_ON (not shown). Specifically, the switching control circuit 102 includes a first set of switches $S_{X\_OP}$ and a second set of switches $S_{X\_PB}$ that are mutually exclusively controlled by the activation signal HS_ON, as well as a first set of resistors $R_{X\_OP}$ and a second set of resistors $R_{X\_PB}$, where X is an integer from 1 to 5 as demonstrated in the example of FIG. 4. All of the resistors $R_{X\_PB}$ and $R_{X\_OP}$, as well as the resistors $R_2$, $R_3$, and $R_4$, can be substantially the same type of the resistors.

Each of the switches $S_{2\_PB}$, $S_{3\_PB}$, and $S_{4\_PB}$ interconnects the high power voltage rail 14 with respective resistors $R_{2\_PB}$, $R_{3\_PB}$, and $R_{4\_PB}$, the switch $S_{1\_PB}$ and respective resistor $R_{1\_PB}$ interconnects the current source 118 and the first current path 106 at the emitter of the BJT Q1, and the switch $S_{5\_PB}$ and respective resistor $R_{5\_PB}$ interconnects the source of the P-MOSFET P5 and the second current path 108 at the emitter of the BJT Q2. Thus, the switches $S_{X\_PB}$ are activated by de-asserting the activation signal HS_ON for pre-biasing the BJTs Q1, Q2, and Q3 in the respective first, second, and third current paths 106, 108, and 110, as well as the P-MOSFET P5, as described in greater detail below. Alternatively, the activation signal HS_ON is asserted to activate the switches $S_{X\_OP}$ to couple the first, second, and third reference currents $I_1$, $I_2$, and $I_3$ and the sense current $I_{SENSE}$ to the current control circuit 104 via the respective resistors $R_{X\_OP}$ (demonstrated by the state of the switches $S_{X\_OP}$ in the example of FIG. 4). Furthermore, it is to be understood that the high-side current-sense system 50 can be disabled by the enable signal EN (not shown in the example of FIG. 4), such that all of the switches $S_{X\_OP}$ and $S_{X\_PB}$ can be opened in response to the enable signal EN being de-asserted.

As described above, in the example of FIG. 4, the resistors $R_{2\_OP}$ and $R_{3\_OP}$ and their respective switches $S_{2\_OP}$ and $S_{3\_OP}$, the resistors $R_{2\_PB}$ and $R_{3\_PB}$ and their respective switches $S_{2\_PB}$ and $S_{3\_PB}$, the resistors $R_{1\_PB}$ and $R_{5\_PB}$ and their respective switches $S_{1\_PB}$ and $S_{5\_PB}$, the BJTs Q1 and Q2, the P-MOSFETs P1 and P2, the N-MOSFETs N5 and N7, the N-MOSFETs N6 and N8, and the resistors $R_3$ and $R_4$ all can be matched components relative to each other, such that the first and second bias currents $I_{B1}$ and $I_{B2}$ have substantially equal magnitudes. As a result, the OTA circuit 150 can have a substantially small input referred offset voltage $V_{OS}$ and a good power supply rejection ratio (PSRR) with respect to the voltage $V_{EXT}$. The current source 160 that conducts the current $I_{SI}$, along with the first and second bias current sources 114 and 116 that conduct the respective currents $I_{B1}$ and $I_{B2}$, can be such that a voltage drop across the respective resistors $R_2$, $R_3$, and $R_4$ remains substantially constant under process and temperature variations. Furthermore, the bias current sources 112 include the third bias current source 118 that can be an exact current source that conducts the sense offset current $I_{SE}$.

In the example of FIG. 4, just prior to the assertion of the activation signal HS_ON, the high-side power MOSFET HS_N is about to activate fully and all of the switches $S_{X\_OP}$ are open and all of the switches $S_{X\_PB}$ are closed. Therefore, the third bias current source 118 conducts the sense offset current $I_{SE}$ from the voltage $V_{EXT}$ via the resistors $R_{1\_PB}$ and $R_{2\_PB}$ and the first and second bias current sources conduct the respective first and second bias currents $I_{B1}$ and $I_{B2}$ from the voltage $V_{EXT}$ via the respective resistors $R_{2\_PB}$ and $R_{3\_PB}$ and the respective first and second current paths 106 and 108. Likewise, the third reference current $I_3$ flows from the voltage $V_{EXT}$ via the resistor $R_{4\_PB}$ and through the third current path 110. The sense current $I_{SENSE}$ flows from the voltage $V_{EXT}$ through the resistors $R_{3\_PB}$ and $R_{5\_PB}$ through the P-MOSFET P5. Thus, the sense current $I_{SENSE}$ can remain at a magnitude that is substantially equal to the magnitude of the sense offset current $I_{SE}$. As a result, the current control circuit 104 and the bias current sources 112 are pre-biased at a substantially settled state. Accordingly, prior to the assertion of the activation signal HS_ON, the switching of the respective high-side and low-side power MOSFETs HS_N and LS_N has substantially no transient effect on the magnitude of the sense current $I_{SENSE}$.

Upon the activation signal HS_ON being asserted, all of the switches $S_{X\_OP}$ are closed and all of the switches $S_{X\_PB}$ are opened (i.e., as demonstrated in the example of FIG. 4). Therefore, the sense offset current $I_{SE}$ and the first bias current $I_{B1}$ are conducted from the first reference current $I_1$ (i.e., from the first sense MOSFET N1) via the resistors $R_{1\_OP}$ and $R_{2\_OP}$, respectively. Similarly, the second bias current $I_{B2}$ and the sense current $I_{SENSE}$ are conducted from the second reference current I₂ (i.e., from the second sense MOSFET N2) via the resistor $R_{3\_OP}$ and the switch $S_{5\_OP}$, respectively. Likewise, the third reference current I₃ is conducted from the phase node 16 via the resistor $R_{4\_OP}$, and has a magnitude that is based on the magnitudes of the first and second bias currents $I_{B1}$ and $I_{B2}$. The magnitude of the sense current $I_{SENSE}$ is controlled by the voltage magnitude at the node 156.

The OTA circuit 150 thus begins to sense the magnitude of the output current $I_{OUT}$. Because the current control circuit 104 and the bias current sources 112 are pre-biased at the substantially settled state and the high-side power MOSFET HS_N is substantially fully activated, switching transient effects that could affect the magnitude of the sense current $I_{SENSE}$ are substantially mitigated. As a result, the sense current $I_{SENSE}$ can quickly settle for accurate sensing of the magnitude of the output current $I_{OUT}$. The sensing speed and the sensing accuracy are thus substantially improved, particularly if the switching frequency of the power regulator system 10 is high and the activation time of the high-side power MOSFET HS_N is small.

The OTA 150 continues to track and sense the output current $I_{OUT}$ until the activation signal HS_ON is de-asserted. At approximately the time of the activation signal HS_ON becoming de-asserted and the high-side power MOSFET HS_N is still "nearly on" or fully activated, all of the switches in the switching control circuit 102 change state. As a result, the high-side power MOSFET HS_N and the sense MOSFETs N1 and N2 are all de-coupled from the OTA 150. Therefore, transient effects on the sense current $I_{SENSE}$, such as in response to deactivation of the high power MOSFETs HS_N, are substantially mitigated. While the activation signal HS_ON remains de-asserted, the sense current $I_{SENSE}$ is held at approximately the same amplitude as the sense offset current $I_{SE}$, assuming no variation between the associated electronic components. As a result, the current control circuit 104 and the bias current sources 112 are pre-biased at a favorable settled state to await the next sense request via the next assertion of the high-side activation signal HS_ON.

Based on the above described operation of the OTA circuit 150, the magnitude of the sense current $I_{SENSE}$, when the OTA 150 tracks and senses the output current $I_{OUT}$, can be described by the following expression:

$$I_{SENSE} = \left(\frac{I_{OUT}}{M}\right) + I_{OS} + I_{SE} \quad \text{Equation 1}$$

Where: M is a proportionality constant of the size mirroring ratio of the power MOSFET HS_N relative to the sense N-MOSFETs N1 or N2;
$I_{OS}$ is a sense offset current due to the offset voltage $V_{OS}$ of the OTA circuit 150.

As demonstrated by Equation 1, a linear relationship exists between the magnitude of the sense current $I_{SENSE}$ and the output current $I_{OUT}$. To achieve the linear relationship, as demonstrated in Equation 1, the high-side power MOSFET HS_N and the first and second N-MOSFETs N1 and N2 can be operating well within the triode/linear region.

As described above, the first and second bias currents $I_{B1}$ and $I_{B2}$ have substantially equal magnitudes based on substantially matched electronic components in each of the switching control circuit 102, the current control circuit 104, and the bias current sources 112. Such matching can improve PSRR of the OTA circuit 150. In addition, the source degeneration structure of each of the bias current sources 112 can improve matching of the bias currents $I_{B1}$ and $I_{B2}$, thus mitigating the magnitude of an input-referred offset voltage $V_{OS}$ of the OTA circuit 150, as well as possible noise contributions of the N-MOSFETs N6 and N8. However, temperature and process variations in the electronic components of the switching control circuit 102, the current control circuit 104, and the bias current sources 112 can result in the generation of the offset voltage $V_{OS}$ between the inputs of the OTA circuit 150 that receive the first and second bias currents $I_{B1}$ and $I_{B2}$. The sources of the offset voltage $V_{OS}$ can be quantified based on a number of expressions.

A first contribution $V_{OS1}$ to the offset voltage $V_{OS}$ can result from a mismatch in physical parameters between the N-MOSFETs N6 and N8, as described by the following expression:

$$V_{OS1} = \left(\frac{A_\beta}{\sqrt{WL}}\right)_{N6,N8} * \frac{1}{1 + \frac{I_{SI} * R_b}{\left(\frac{V_{GS} - Vth}{2}\right)}} * (V_T + I_{SI} * R_{IN}) \quad \text{Equation 2}$$

Where: $A_\beta$ is a percentage mismatch parameter between the physical parameters of the N-MOSFETs N6 and N8;
WL is a theoretical area of the N-MOSFETs N6 and N8;
$R_b$ is an average resistance value of the resistors R₂ and R₃;
$V_{GS}$ is a gate-source voltage of the N-MOSFETs N6 and N8;
Vth is a threshold voltage of the N-MOSFETs N6 and N8;
$V_T$ is equal to k*T/q; and
$R_{IN}$ is an average resistance value of the resistors $R_{2\_OP}$ and $R_{3\_OP}$ in series with the switches $S_{2\_OP}$ and $S_{3\_OP}$, respectively.

A second contribution $V_{OS2}$ to the offset voltage $V_{OS}$ can result from a mismatch in threshold voltage between the N-MOSFETs N6 and N8, as described by the following expression:

$$V_{OS2} = \left(\frac{A_{Vth}}{\sqrt{WL}}\right)_{N6,N8} * \frac{1}{\left(\frac{V_{GS} - Vth}{2}\right) + I_{SI} * R_b} * (V_T + I_{SI} * R_{IN}) \quad \text{Equation 3}$$

Where: $A_{Vth}$ is a voltage mismatch parameter between the threshold voltages of the N-MOSFETs N6 and N8.

A third contribution $V_{OS3}$ to the offset voltage $V_{OS}$ can result from a mismatch in resistance magnitudes between the resistors R₂ and R₃, as described by the following expression:

$$V_{OS3} = \left(\frac{\Delta R_b}{R_b}\right) * \frac{1}{1 + \frac{I_{SI} * R_b}{\left(\frac{V_{GS} - Vth}{2}\right)}} * (V_T + I_{SI} * R_{IN}) \quad \text{Equation 4}$$

Where: $\Delta R_b$ is a resistance mismatch between the resistors R₂ and R₃.

Equations 2 through 4 above thus represent contributions to the offset voltage $V_{OS}$ based on the N-MOSFETs N6 and N8 operating in a strong inversion saturation region. A fourth contribution $V_{OS4}$ to the offset voltage $V_{OS}$ can result from a mismatch in resistance magnitudes of the resistors $R_{2\_OP}$ and $R_{3\_OP}$ in series with the switches $S_{2\_OP}$ and $S_{3\_OP}$, respectively, as described by the following expression:

$$V_{OS4} = \left(\frac{\Delta R_{IN}}{R_{IN}}\right) * I_{S1} * R_{IN} \qquad \text{Equation 5}$$

Where: $\Delta R_{IN}$ is a resistance mismatch between the resistors $R_{2\_OP}$ and $R_{3\_OP}$ in series with the switches $S_{2\_OP}$ and $S_{3\_OP}$, respectively.

A fifth contribution $V_{OS5}$ to the offset voltage $V_{OS}$ can result from a mismatch of the BJTs Q1 and Q2, as described by the following expression:

$$V_{OS5} = \left(\frac{A_C}{\text{AREA}}\right)_{Q1,Q2} * V_T \qquad \text{Equation 6}$$

Where: $A_C$ is a percentage mismatch parameter between the collector currents of the BJTs Q1 and Q2; and
AREA is a theoretical area of the BJTs Q1 and Q2.

Based on Equations 2 through 6 above, a total magnitude of the offset voltage $V_{OS}$ can be described by the following expression:

$$V_{OS} = \sqrt{V_{OS1}^2 + V_{OS2}^2 + V_{OS3}^2 + V_{OS4}^2 + V_{OS5}^2} \qquad \text{Equation 7}$$

A non-zero magnitude of the offset voltage $V_{OS}$ can thus contribute to offset associated with the sense current $I_{SENSE}$. The offset voltage $V_{OS}$ can be obtained by design optimization of these offset contributions based on Equations 2 through 7 above, such that the offset associated with the sense current $I_{SENSE}$ can be very small.

It is to be understood that the OTA circuit 150 is not intended to be limited to the example of FIG. 4. As an example, additional circuit configurations for each of the switching control circuit 102, current control circuit 104, and the bias current sources 112 are conceivable for the OTA circuit 150. As another example, in the above described example of monitoring the output current $I_{OUT}$ in a linear power regulator, as opposed to a switching power regulator, the switching control circuit 102 can be omitted based on a lack of switching transients between the high and low-side power MOSFETs HS_N and LS_N. Accordingly, the OTA circuit 150 can be configured in any of a variety of ways.

Figure 5:
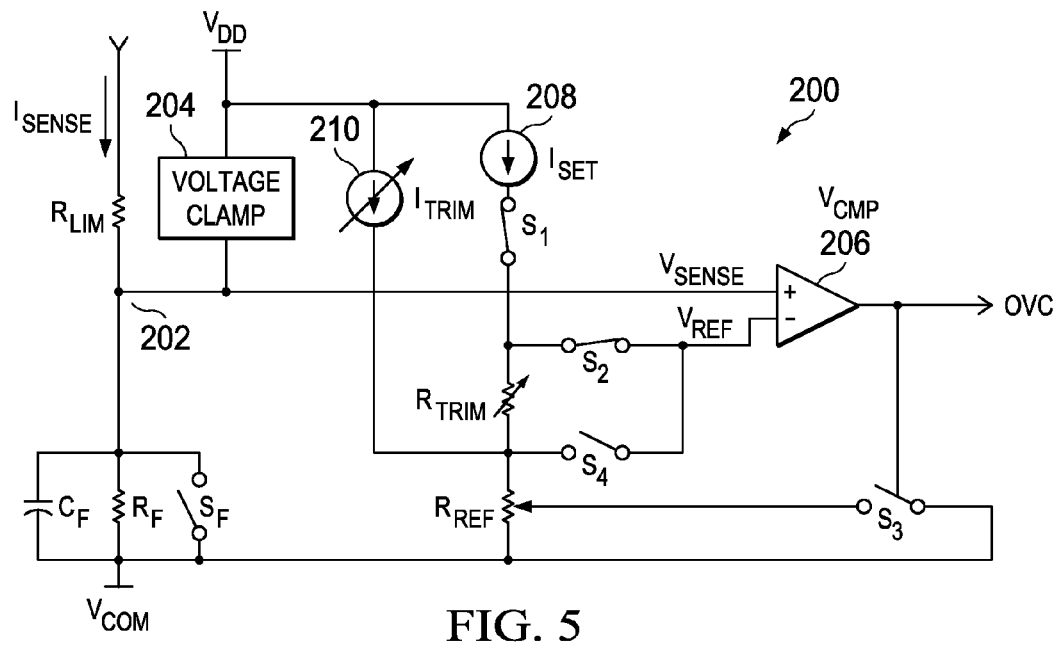
FIG. 5 illustrates an example of a sense circuit in accordance with an aspect of the invention.

FIG. 5 illustrates an example of a sense circuit 200 in accordance with an aspect of the invention. The sense circuit 200 can correspond to the sense circuit 28 in the examples of FIGS. 1 and 2. Therefore, reference is to be made to the examples of FIGS. 1-4 in the following description of the example of FIG. 5.

The sense circuit 200 is interconnected between the voltage $V_{DD}$ and the common voltage $V_{COM}$. As an example, the voltage $V_{DD}$ can be an internally provided analog voltage supply that is generated at a magnitude that is less than the external voltage $V_{EXT}$, such as generated from the external voltage $V_{EXT}$. The common voltage $V_{COM}$ can be a negative rail voltage having a magnitude that is selected based on an input common mode range of the sense circuit 28. As an example, the common voltage $V_{COM}$ can be ground, or can be greater than ground. The sense current $I_{SENSE}$ flows from the OTA 26 through a resistor $R_{LIM}$ to the common voltage $V_{COM}$ via a parallel connection of a resistor $R_F$, a capacitor $C_F$, and a switch $S_F$. The switch $S_F$ can be controlled by the high-side activation signal HS_ON or can be substantially synchronized with the switches $S_{X\_PB}$ in the example of FIG. 4. As an example, the switch $S_F$ can be opened during sensing of the output current $I_{OUT}$, such as when the high-side activation signal HS_ON is asserted or when the switches $S_{X\_PB}$ are opened. The switch $S_F$ can be closed when the high-side activation signal HS_ON is de-asserted or when the switches $S_{X\_PB}$ are closed. As a result, the resistor $R_F$, the capacitor $C_F$, and the switch $S_F$ are configured to mitigate switching transients and/or other high-frequency noise associated with the sense current $I_{SENSE}$.

The sense current $I_{SENSE}$ generates a sense voltage $V_{SENSE}$ at a sensing node 202. The resistor $R_{LIM}$ is implemented to limit the magnitude of the sense current $I_{SENSE}$, and to thus limit the sense voltage $V_{SENSE}$ at the sensing node 202 based on the voltage drop across the resistor $R_{LIM}$. In addition, the sense circuit 200 also includes a voltage clamp 204 that is coupled to the sensing node 202. The voltage clamp 204 is configured to clamp the magnitude of the sense voltage $V_{SENSE}$, such as by shunting excess current to ground. As such, the magnitude of the sense voltage $V_{SENSE}$ does not exceed the magnitude of the voltage $V_{DD}$. As a result, the sense circuit 200 can implement smaller, low-voltage electronic devices to conserve IC layout area. The sense voltage $V_{SENSE}$ is provided to a non-inverting input of a comparator 206.

The sense circuit 200 also includes a current source 208 that generates a set current $I_{SET}$ from the voltage $V_{DD}$. The current source 208 can be an exact current source, such that the set current $I_{SET}$ can be an exact current, or it can be a current digital to analog converter (DAC). The set current $I_{SET}$ flows to the common voltage $V_{COM}$ via a switch $S_1$, a trimmable resistor $R_{TRIM}$, and a variable resistor $R_{REF}$. As an example, the resistor $R_{TRIM}$, and the variable resistor $R_{REF}$ can be substantially matched with the resistor $R_F$. Therefore, the set current $I_{SET}$ generates a reference voltage $V_{REF}$ relative to the common voltage $V_{COM}$ via the resistors $R_{TRIM}$ and $R_{REF}$. The reference voltage $V_{REF}$ is provided to an inverting input of the comparator 206 via a switch $S_2$. Thus, the comparator 206 compares the magnitudes of the sense voltage $V_{SENSE}$ and the reference voltage $V_{REF}$. Upon the magnitude of the sense voltage $V_{SENSE}$ being greater than the magnitude of the reference voltage $V_{REF}$, the comparator 206 generates the over-current signal OVC, thus indicating the over-current condition.

The sense circuit 200 also includes a switch $S_3$ that is controlled by the over-current signal OVC. Thus, in response to the over-current signal OVC, the switch $S_3$ closes to couple the common voltage $V_{COM}$ to a portion of the variable resistor $R_{REF}$. Therefore, the resistance magnitude of the variable resistor $R_{REF}$ decreases, resulting in a respective decrease in the magnitude of the reference voltage $V_{REF}$. As a result, the over-current signal OVC becomes latched in a logic-high state until the magnitude of the sense voltage $V_{SENSE}$ becomes less than the reduced magnitude of the reference voltage $V_{REF}$. Accordingly, the switch $S_3$ provides hysteresis to the functionality of the sense circuit 200, such that fluctuations in the magnitude of the sense voltage $V_{SENSE}$ upon the occurrence of the over-current condition do not result in removal of the indication of the over-current condition.

As described above, the first and second bias currents $I_{B1}$ and $I_{B2}$ have substantially equal magnitudes based on substantially matched electronic components in each of the switching control circuit 102, the current control circuit 104, and the bias current sources 112. However, temperature and process variations in the electronic components of the switching control circuit 102, the current control circuit 104, and the bias current sources 112 can result in the generation of the offset voltage $V_{OS}$. In addition, process variations can also result in variation of the constant M that relates to the size mirroring proportionality of the high-side power MOSFET HS_N relative to the sense N-MOSFETs N1 or N2. Therefore, these variations can affect the magnitude of the sense current $I_{SENSE}$, as demonstrated in Equation 1 above. The magnitude of the sense current $I_{SENSE}$ also includes a component that is approximately equal to the sense offset current $I_{SE}$. The sense offset current $I_{SE}$ can have a magnitude that is selected such that, upon the magnitude of the output current $I_{OUT}$ being approximately zero, the OTA 26 can be properly biased to maintain sufficient loop gain and speed for accurate sensing of the magnitude of the output current $I_{OUT}$ under all variations of the offset voltage $V_{OS}$. Process variations can also exist in the sensing circuit 200, such as the input-referred offset voltage of the comparator 206 and the matching of the resistors $R_{TRIM}$ and $R_{REF}$ relative to the resistor $R_F$.

To accurately sense the magnitude of the output current $I_{OUT}$, the sense circuit 200 includes trimming capability to substantially mitigate the above described deleterious offset effects on the accuracy of the high-side current sense system 50. Specifically, the sense current 200 includes a trimmable current source 210 that generates a current $I_{TRIM}$. As an example, the trimmable current source 210 can be mirrored from the current source 118 in the example of FIG. 4, such that the current $I_{TRIM}$ is an adjustable version of the current $I_{SE}$. The current $I_{TRIM}$ flows to the common voltage $V_{COM}$ via the resistor $R_{REF}$, such that the current $I_{TRIM}$ can contribute to the reference voltage $V_{REF}$ via a switch $S_4$.

The sense circuit 200 can thus be adjustable in a two-part trimming operation to adjust the offset and gain of the high-side current-sense system 50. First, the offset of the high-side current-sense system 50 can be adjusted (i.e., substantially mitigated) by closing the switch $S_4$ and opening the switches $S_1$ and $S_2$ and by setting the appropriate magnitude of the current $I_{TRIM}$. The output current $I_{OUT}$ can then be set to a magnitude of approximately zero. The current $I_{TRIM}$ can then be adjusted until the over-current signal OVC switches from logic-low to logic-high. At the time that the over-current signal OVC is asserted, the following equation is satisfied:

$$(I_{OS}+I_{SE})*R_F = I_{TRIM}*R_{REF}+V_{CMP} \quad \text{Equation 8}$$

Where: $V_{CMP}$ is an input referred offset voltage associated with the comparator 206.

Next, with the current $I_{TRIM}$ being set, the gain of the high-side current-sense system 50 can be adjusted to a predetermined target value by opening the switch $S_4$ and closing the switches $S_1$ and $S_2$ and by setting the appropriate magnitude of the resistance $R_{TRIM}$. The output current $I_{OUT}$ can then be set to an arbitrary magnitude. The resistance magnitude $R_{TRIM}$ can then be adjusted until the over-current signal OVC is asserted from a logic-low to a logic-high state. Assuming that the input common mode rejection ratio (CMRR) of the comparator 206 is acceptable and that the input referred offset voltage $V_{CMP}$ of the comparator 206 is constant over its entire input range, the following equation is satisfied at the time that the over-current signal OVC is asserted:

$$\left(\frac{1}{M}*I_{OUT}+I_{OS}+I_{SE}\right)*R_F = $$
$$I_{TRIM}*R_{REF}+V_{CMP}+I_{SET}*(R_{REF}+R_{TRIM}) \quad \text{Equation 9}$$

Accordingly, Equations 8 and 9 can be combined as follows:

$$I_{OUT} = M*\left(\frac{R_{REF}+R_{TRIM}}{R_F}\right)*I_{SET} \quad \text{Equation 10}$$

Equation 10 therefore demonstrates the relationship between the output current $I_{OUT}$ and the set current $I_{SET}$. The gain of the high-side current sense system 50 can thus be adjusted to a predetermined target value by setting the appropriate resistance magnitude $R_{TRIM}$ to compensate for the variation of the constant M as it relates to the size mirroring proportionality of the high-side power MOSFET HS_N relative to the sense N-MOSFETs N1 or N2. Accordingly, after the above two-part trimming operation, with the adjusted current $I_{TRIM}$ and the adjusted resistance $R_{TRIM}$, along with the opened switch $S_4$ and the closed switches $S_1$ and $S_2$, a wide range of magnitudes of the output current $I_{OUT}$ can thus be sensed and detected by simply setting the corresponding set current $I_{SET}$.

It is to be understood that the sensing circuit 200 is not limited to the example of FIG. 5. For example, additional trimming electronic components can be included in the sensing circuit 200 to adjust the reference voltage $V_{REF}$, such as to adjust the offset and/or gain of the high-side current-sense system 50. As yet another example, alternative manners of determining the magnitude of the sense current $I_{SENSE}$ can be implemented in the sense circuit 200. Accordingly, the sense circuit 200 can be configured in any of a variety of ways.

Figure 6:
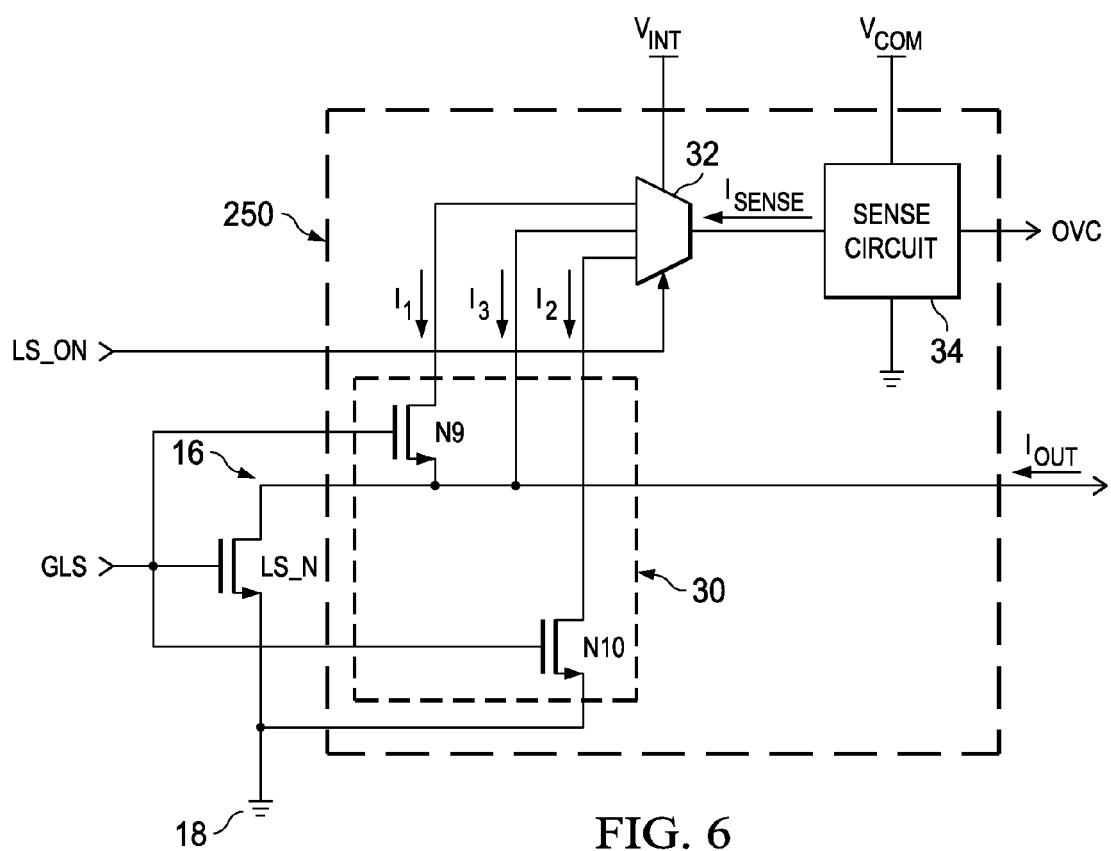
FIG. 6 illustrates an example of a low-side current-sense system in accordance with an aspect of the invention.

FIG. 6 illustrates an example of a low-side current-sense system 250 in accordance with an aspect of the invention. As an example, the low-side current-sense system 250 in the example of FIG. 6 can correspond to the low-side current-sense system 22 in the example of FIG. 1. As such, like reference numbers are used and reference is to be made to the example of FIG. 1 in the following description of the example of FIG. 6.

Similar to as described above in the example of FIG. 1, the low-side current-sense system 250 is configured to monitor a magnitude of the output current $I_{OUT}$ that flows into the phase node 16 and through a power transistor, demonstrated in the example of FIG. 6 as the low-side power MOSFET LS_N. The low-side current-sense system 250 includes the sense MOSFETs 30, which are demonstrated in the example of FIG. 6 as a first N-MOSFET N9 and a second N-MOSFET N10. As an example, the first and second N-MOSFETs N9 and N10 can have a size that is less than the size of the low-side power MOSFET LS_N. Each of the first and second N-MOSFETs N9 and N10 are controlled at a gate by an activation signal GLS. The first N-MOSFET N9 is coupled at a source to the phase node 16 and is configured to conduct a first reference current $I_1$ to the phase node 16 in response to the activation signal GLS. As an example, the activation signal GLS can be an analog signal that is generated from a low-side driver in the switching control circuit 12. The second N-MOSFET N10 is coupled at a source to the low-voltage power rail 18 and is configured to conduct a second reference current $I_2$ to the low-voltage power rail 18 in response to the activation signal GLS. In addition, a third reference current $I_3$ likewise flows to the phase node 16 in response to the activation signal GLS. It is to be understood that, based on the flow of the first and third reference currents $I_1$ and $I_3$ to the phase node 16, the magnitude of the current flow through the low-side power MOSFET LS_N is greater than the magnitude of the output current $I_{OUT}$ flowing into the phase node 16 from the load (not shown). However, the magnitude of the first and third reference currents $I_1$ and $I_3$ can be significantly less than the magnitude of the output current $I_{OUT}$, such that the difference in magnitudes between the current flow through the low-side power MOSFET LS_N and the output current $I_{OUT}$ can be substantially negligible.

In the example of FIG. 6, the OTA 32 is demonstrated as powered by an internally provided analog voltage $V_{INT}$. The first, second, and third reference currents $I_1$, $I_2$, and $I_3$ are provided from the OTA 32. In response, the OTA 32 generates a sense current $I_{SENSE}$ that has a magnitude that is linearly related to (i.e., proportional to) the output current $I_{OUT}$. As an example, the OTA 32 can be configured to conduct approximately equal bias currents through respective current paths of the OTA 32, such that the bias currents set a magnitude of the sense current $I_{SENSE}$ to be linearly related to the output current $I_{OUT}$. For example, the OTA 32 can include a cascode amplifier that is controlled by one or both of the bias currents.

The sense current $I_{SENSE}$ flows to the OTA 32 from the sense circuit 34. The sense circuit 34 is demonstrated in the example of FIG. 6 as interconnecting a common voltage $V_{COM}$ and ground at a front end. As an example, the voltage $V_{COM}$ can be an internally provided analog voltage supply. The voltage $V_{COM}$ can be generated at a magnitude that is less than the internal voltage $V_{INT}$ or the external voltage $V_{EXT}$, and the common voltage $V_{COM}$ can have a magnitude that is selected based on the range of the sense current $I_{SENSE}$ and an input common mode range of the sense circuit 34. As an example, the common voltage $V_{COM}$ can be approximately equal to the voltage $V_{DD}$. The sense circuit 34 is configured to compare the sense current $I_{SENSE}$ with a predetermined magnitude that can be associated with an over-current limit corresponding to the output current $I_{OUT}$. The sense circuit 34 can thus generate the over-current signal OVC in response to the magnitude of the sense current $I_{SENSE}$ exceeding the predetermined magnitude, thus indicating an over-current condition associated with the output current $I_{OUT}$.

For example, the sense circuit 34 can generate a sense voltage having a magnitude that corresponds to the magnitude of the sense current $I_{SENSE}$ and a predetermined reference voltage that is generated from the voltage $V_{COM}$, such that the sense voltage and the predetermined reference voltage can be input to a comparator. In addition, the sense circuit 34 can include a trimmable current source to substantially mitigate a sensing offset of the low-side current-sense system 250. The sense circuit 34 can also include a trimmable resistance that can be adjusted to set an accurate predetermined sensing gain of the low-side current-sense system 250. Accordingly, the sense circuit 34 can be set to provide the over-current signal OVC in response to very accurate and linear current sensing of the output current $I_{OUT}$.

Based on the above description of the low-side current-sense circuit 250, it is demonstrated that the low-side current-sense circuit 250 operates substantially similar to the high-side current-sense circuit 50. As an example, the OTA 32 in the example of FIG. 6 can be configured as a substantially inverted version of the OTA 150 in the example of FIG. 4, such as to include a reversed current-flow direction of the first, second, and third reference currents $I_1$, $I_2$, and $I_3$, thus also of the first and second bias currents $I_{B1}$ and $I_{B2}$. For example, the OTA 32 can include a current control circuit, similar to the current control circuit 104, that includes NPN BJTs and N-MOSFETs in the current paths for the first and second bias currents $I_{B1}$ and $I_{B2}$ and the third reference current $I_3$. Similarly, the OTA 32 can include bias current sources that conduct the currents $I_{SE}$, $I_{SI}$, $I_{B1}$, and $I_{B2}$ from the voltage $V_{EXT}$ or the voltage $V_{INT}$ at the positive voltage rail 14, such as via P-MOSFETs in the case of the currents $I_{SI}$, $I_{B1}$, and $I_{B2}$.

Furthermore, the sense circuit 34 can likewise be similar to the sense circuit 200 in the example of FIG. 5, except that the currents $I_{SET}$ and $I_{TRIM}$ flow from the voltage $V_{COM}$ to ground instead of the voltage $V_{DD}$, and that a voltage clamp, such as the voltage clamp 204, can be eliminated.

As described above in the example of FIG. 1, it is to be understood that the power regulator system 10 need not include both the high-side and the low-side current-sense systems 50 and 250, but could instead include just one of the high-side and the low-side current-sense systems 50 and 250. As another example, the low-side current-sense system 250 could be configured to monitor a current through a linear power regulator that conducts the output current $I_{OUT}$ in response to an analog control signal (e.g., instead of the activation signal GLS).

It is to be understood that the low-side current-sense system is not intended to be limited to the example of FIG. 6. As an example, the OTA 32 can be powered by the voltage $V_{EXT}$ instead of the internally provided voltage $V_{INT}$. As another example, the sense MOSFETs 30 could include a single MOSFET instead of a pair of matched MOSFETs. In addition, in the above described example of monitoring the output current $I_{OUT}$ in a linear power regulator for some applications, as opposed to a switching power regulator, the sense MOSFET N9 could be omitted entirely. Furthermore, it is to be understood that the direction of the flow of the sense current $I_{SENSE}$ can be changed by adding one or more current mirrors in the OTA 26 in the example of FIG. 2 or in the OTA 32 in the example of FIG. 6, such that the high-side and the low-side sense circuits 28 and 34 can be interchanged or shared. Accordingly, the low-side current-sense system 250 can be configured in any of a variety of ways.

Figure 7:
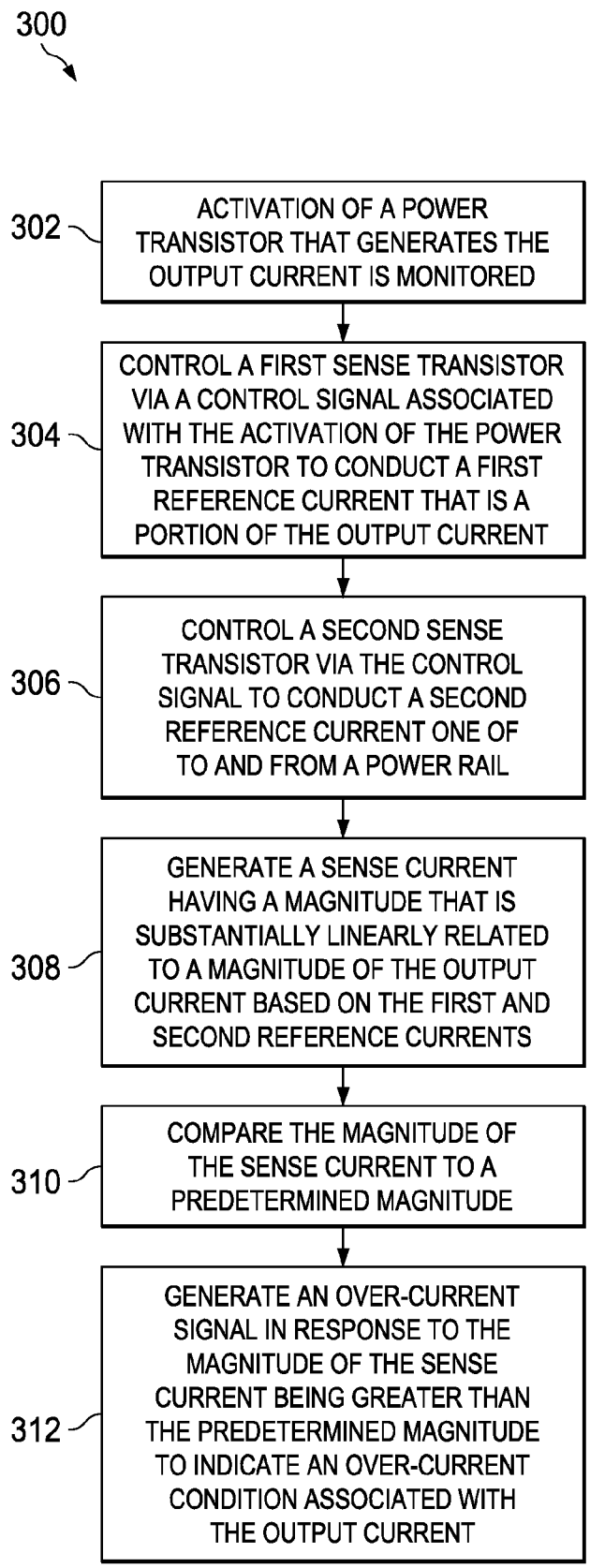
FIG. 7 illustrates an example of a method for sensing a magnitude of an output current flowing through a power transistor in accordance with an aspect of the invention.

In view of the foregoing structural and functional features described above, certain methods will be better appreciated with reference to FIG. 7. It is to be understood and appreciated that the illustrated actions, in other embodiments, may occur in different orders and/or concurrently with other actions. Moreover, not all illustrated features may be required to implement a method.

FIG. 7 illustrates an example of a method 300 for sensing a magnitude of an output current flowing through a power transistor. At 302, activation of the power transistor that generates the output current is monitored. The power transistor can be a high-side or a low-side power MOSFET in a switching power regulator, or could be a power MOSFET of a linear power regulator, such as controlled by an analog control signal. At 304, a first sense transistor is controlled via a control signal associated with activation of the power transistor to conduct a first reference current. The first reference current can flow to or from an OTA, and can include a first bias current and a sense offset current, such as generated from an exact current source. At 306, a second sense transistor is controlled via the control signal to conduct a second reference current one of to and from a power rail. The second reference current can flow to or from the OTA, and can include a second bias current. The OTA can also conduct a third reference current.

At 308, a sense current having a magnitude that is linearly related to a magnitude of the output current is generated based on the first and second reference currents. The sense current can be a portion of the second reference current, and can be generated from a cascode amplifier in the OTA based on a magnitude of the first and/or second bias currents. At 310, the magnitude of the sense current is compared to a predetermined magnitude. The comparison can be made in a sense circuit that generates a sense voltage from the sense current and compares the sense voltage with a predetermined reference voltage. The predetermined reference voltage can be trimmed to adjust the gain and/or the offset of the current sense system. At 312, an over-current signal is generated in response to the magnitude of the sense current being greater than the predetermined magnitude to indicate an over-current condition associated with the output current. The over-current signal can be latched based on a hysteresis function of the sense circuit, thus maintaining the indication of the over-current condition despite variations of the sense current.

What have been described above are examples of the invention. It is, of course, not possible to describe every conceivable combination of components or methodologies for purposes of describing the invention, but one of ordinary skill in the art will recognize that many further combinations and permutations of the invention are possible. Accordingly, the invention is intended to embrace all such alterations, modifications, and variations that fall within the scope of this application, including the appended claims.

What is claimed is:

1. An on-chip current-sense system for measuring a magnitude of an output current flowing one of to and from a phase node and through a power transistor, the system comprising:
    a first sense transistor configured to conduct a first reference current one of to and from the phase node;
    a second sense transistor configured to conduct a second reference current one of to and from a power rail, the first and second sense transistors being substantially identical and being proportionally matched to the power transistor;
    an operational transconductance amplifier (OTA) configured to receive the first reference current, the second reference current, and a third reference current that flows one of to and from the phase node and to generate a sense current that is substantially linearly related to the output current in response to the first, second, and third reference currents; and
    a sense circuit configured to compare the sense current with a predetermined magnitude and to generate an over-current signal in response to the sense current being greater than the predetermined magnitude to indicate an over-current condition associated with the output current.

2. The system of claim 1, wherein the OTA comprises a current control circuit that comprises a cascode amplifier that is configured to conduct a first bias current that is a portion of the first reference current in a first current path and a second bias current that is a portion of the second reference current in a second current path, the first and second bias currents being approximately equal.

3. The system of claim 2, wherein the OTA comprises a switching control circuit that is configured to switch the current control circuit to the power rail to pre-bias the cascode amplifier prior to activation of the power transistor to substantially mitigate variations of the magnitude of the sense current in response to switching transients of the power transistor.

4. The system of claim 2, wherein the cascode amplifier comprises a first bipolar junction transistor (BJT) and a first metal-oxide semiconductor field-effect transistor (MOSFET) in the first current path and a second BJT and a second MOSFET in the second current path, and wherein each of the first and second BJTs and each of the first and second MOSFETs are connected as current-mirrors.

5. The system of claim 2, wherein the current control circuit comprises a level-shifter circuit in a third current path that conducts the third reference current, the level-shifter circuit being controlled by the cascode amplifier to set a magnitude of the third reference current, the level-shifter circuit being configured to control a magnitude of the sense current based on the magnitude of the third reference current.

6. The system of claim 2, wherein the OTA comprises a first bias current source that conducts the first bias current, a second bias current source that conducts the second bias current source, and a third current source that conducts a sense offset current that is a remaining portion of the first reference current and is configured to provide sufficient biasing for the OTA to maintain sufficient loop gain and sensing speed for accurate sensing the magnitude of the output current under process and temperature variations at magnitudes of the output current that are greater than or equal to zero.

7. The system of claim 6, wherein the sense circuit is configurable to adjust a gain of the on-chip current-sense system to compensate for process variations associated with the power transistor relative to at least one of the first and second sense transistors, and to substantially mitigate an offset of the on-chip current-sense system resulting from at least one of a first offset voltage associated with the sense circuit, a second offset voltage between a first input that receives the first bias current and a second input that receives the second bias current resulting from the process variations, and the sense offset current.

8. The system of claim 2, wherein the sense circuit comprises a comparator configured to compare a sense voltage having a magnitude that corresponds to the magnitude of the sense current with a reference voltage that corresponds to the predetermined magnitude associated with the over-current condition of the output current, and to generate the over-current signal upon the magnitude of the sense voltage being greater than the magnitude of the reference voltage.

9. The system of claim 8, wherein the sense circuit further comprises:
    a trimmable current source associated with the reference voltage that is adjustable to substantially mitigate an offset of the on-chip current-sense system resulting from at least one of a first offset voltage associated with the sense circuit, a second offset voltage between a first input that receives the first bias current and a second input that receives the second bias current resulting from process variations, and an intentionally added sense offset current that provides sufficient biasing for the OTA; and
    a trimmable resistor associated with the reference voltage that is adjustable to adjust a gain of the on-chip current-sense system to compensate for process variations associated with the power transistor relative to at least one of the first and second sense transistors.

10. An integrated circuit comprising a power converter system and the on-chip current sensing system of claim 1.

11. A method for sensing a magnitude of an output current flowing one of to and from a phase node and through a power transistor, the method comprising:
    monitoring an activation of the power transistor that generates the output current;
    controlling a first sense transistor via a control signal that is associated with the activation of the power transistor to conduct a first reference current one of to and from the phase node;
    controlling a second sense transistor via the control signal to conduct a second reference current one of to and from a power rail, the first and second sense transistors being substantially identical and being proportionally matched to the power transistor;
    conducting a third reference current one of to and from the phase node in response to the control signal;

generating a sense current having a magnitude that is linearly related to a magnitude of the output current based on the first, second, and third reference currents;

comparing the magnitude of the sense current to a predetermined magnitude; and generating an over-current signal in response to the magnitude of the sense current being greater than the predetermined magnitude to indicate an over-current condition associated with the output current.

12. The method of claim 11, wherein generating the sense current comprises:

conducting a first bias current that is a portion of the first reference current in a first current path of an operational transconductance amplifier (OTA);

conducting a second bias current that is a portion of the second reference current in a second current path in the OTA, the first and second current paths in the OTA being configured as a cascode amplifier; and setting magnitudes of the first and second bias currents to be approximately equal via a current mirror connection between the first and second current paths.

13. The method of claim 12, wherein setting the magnitudes of the first and second bias currents comprises setting the magnitudes of the first and second bias currents approximately equal via a current mirror connection between at least one of a first bipolar junction transistor (BJT) and a first metal-oxide semiconductor field effect transistor (MOSFET) in the first current path and a second BJT and a second MOSFET in the second current path.

14. The method of claim 12, further comprising controlling a magnitude of the third reference current at a level-shifter in a third current path of the OTA based on the cascode amplifier to set a magnitude of the sense current.

15. The method of claim 14, further comprising conducting a sense offset current that is a remaining portion of the first reference current via an exact current source to provide sufficient loop gain and biasing of the OTA to generate the sense current at magnitudes of the output current that are greater than or equal to zero; and wherein generating the sense current comprises conducting a remaining portion of the second reference current as the sense current through a fourth current path that is biased by the level-shifter circuit.

16. The method of claim 12, further comprising switching the first and second current paths to the power rail to pre-bias the OTA to substantially mitigate transient effects of the sense current due to activation of the power transistor.

17. The method of claim 12, wherein comparing the magnitude of the sense current to the predetermined magnitude comprises comparing a sense voltage having a magnitude that corresponds to the magnitude of the sense current with a reference voltage that corresponds to the predetermined magnitude, the method further comprising:

adjusting a trimmable current source to substantially mitigate an offset of the on-chip current-sense system resulting from at least one of a first offset voltage associated with the sense circuit, a second offset voltage between a first input that receives the first bias current and a second input that receives the second bias current resulting from process variations, and an intentionally added sense offset current that provides sufficient biasing for the OTA; and a trimmable resistor that is adjustable to adjust a sensing gain to compensate for process variations associated with the power transistor relative to at least one of the first and second sense transistors.

18. An on-chip current-sense system for measuring a magnitude of an output current flowing one of to and from a phase node and through a power transistor, the system comprising:

means for conducting a first reference current one of to and from the phase node;

means for conducting a second reference current one of to and from a power rail;

means for generating a sense current that is substantially linearly related to the output current in response to the first reference current, the second reference current, and a third reference current that flows one of to and from the phase node;

means for generating a sense voltage having a magnitude that corresponds to the magnitude of the sense current; and means for comparing the magnitude of the sense voltage with a predetermined reference voltage and for generating an over-current signal in response to the magnitude of the sense voltage being greater than the magnitude of the predetermined reference voltage to indicate an over-current condition associated with the output current.

19. The system of claim 18, further comprising means for coupling the means for generating the sense current to the power rail prior to activation of the power transistor to pre-bias the means for generating the sense current prior to activation of the power transistor to substantially mitigate variations of the magnitude of the sense current in response to switching transients of the power transistor.

20. The system of claim 18, wherein the means for generating the sense current comprises:

means for mirroring a bias current that is a portion of at least one of the first and second reference currents to a current path that comprises at least one bipolar junction transistor (BJT); and means for setting a magnitude of the sense current in response to a magnitude of the mirrored bias current.

* * * * *